US009618851B2

(12) United States Patent
Xiao et al.

(10) Patent No.: US 9,618,851 B2
(45) Date of Patent: Apr. 11, 2017

(54) PHOTOINDUCED ALIGNMENT APPARATUS (71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Yin Xiao, Beijing (CN); Feng Liu, Beijing (CN); Jinyang Deng, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan Province (CN)

( * ) Notice: Subject to any disclaimer, the term of this patent is extended or adjusted under 35 U.S.C. 154(b) by 0 days.

(21) Appl. No.: 14/802,606

(22) Filed: Jul. 17, 2015

(65) Prior Publication Data
US 2016/0252822 A1    Sep. 1, 2016

(30) Foreign Application Priority Data
Feb. 28, 2015    (CN) .................... 2015 2 0119871 U (51) Int. Cl.
*G03B 27/42*    (2006.01)
*G03F 7/20*    (2006.01)

(52) U.S. Cl.
CPC ................ *G03F 7/70058* (2013.01)

(58) Field of Classification Search
CPC .. G03F 7/70733; G03F 7/70358; G03F 7/707; G03F 7/20; G03F 7/70716; G03F 7/70275; G03F 7/70425; G03F 1/42; G03F 7/201; G03F 7/7035; G03F 7/70691; G03F 7/70975; G03F 7/70141; G03F 7/70308; G03F 7/70383; G03F 7/7075; G03F 7/70816; G03F 9/70
See application file for complete search history.

(56) References Cited

U.S. PATENT DOCUMENTS

| | | | | |
|---|---|---|---|---|
| 5,164,974 | A * | 11/1992 | Kariya | G03F 7/70733 250/491.1 |
| 2003/0147032 | A1* | 8/2003 | Park | G02F 1/1339 349/124 |
| 2006/0092512 | A1* | 5/2006 | Shioya | G02B 5/003 359/487.03 |
| 2010/0173236 | A1* | 7/2010 | Yasunobe | G03F 7/70891 430/30 |
| 2012/0164585 | A1* | 6/2012 | Ikeda | G03F 7/70425 430/325 |

* cited by examiner

*Primary Examiner* — Mesfin Asfaw
(74) *Attorney, Agent, or Firm* — Nath, Goldberg & Meyer; Joshua B. Goldberg; Christopher Thomas (57) ABSTRACT

The present invention relates to photoinduced alignment apparatus, comprising a plurality of supporting bases used to support substrates; an exposure device exposing the substrates on the supporting base; a driving mechanism driving the exposure device to move, so that the exposure device passes through the substrates on the plurality of the supporting bases, successively; and a loading and unloading device used to load and unload a substrate on a supporting base beyond the irradiation range of the exposure device.

10 Claims, 6 Drawing Sheets

PHOTOINDUCED ALIGNMENT APPARATUS

FIELD OF THE INVENTION

The present invention relates to the field of liquid crystal display technology, in particular to photoinduced alignment apparatus.

BACKGROUND OF THE INVENTION

A liquid crystal display panel generally includes an array substrate, a color filter substrate, and liquid crystals provided between the array substrate and the color filter substrate. The array substrate and the color filter substrate both include an alignment layer configured to restrict arrangement of liquid crystal molecules, so that the liquid crystal molecules, when not in an electric field, are arranged in a preset initial direction.

At present, the alignment layer generally may be manufactured by rubbing or exposing a polyimide film (PI film), that is so called "rubbing alignment" or "photoinduced alignment". A photoinduced alignment process is a process in which PI film is irradiated with UV light to cause photo polymerization, photo-isomerization or photo-decomposition reaction in polyimide molecules in the PI film, so as to bring on anisotropy to induce the alignment of the liquid crystal molecules. In the photoinduced alignment process, the PI film does not contact other media. Hence problems such as scraping contamination and electrostatic breakdown in a rubbing alignment process will not occur.

Figure 1:
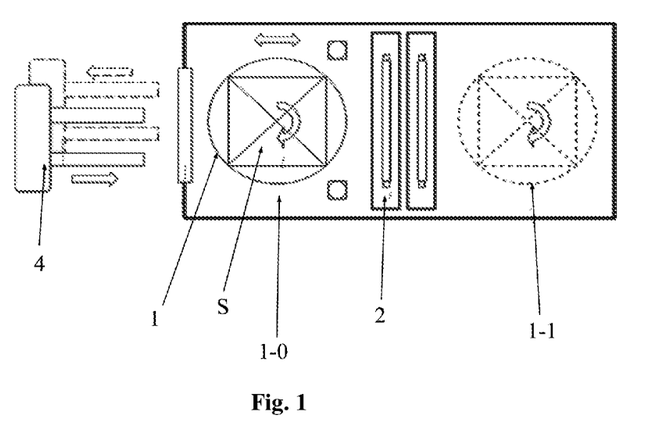
FIG. 1 illustrates a schematic diagram of existing photoinduced alignment apparatus.

FIG. 1 illustrates a schematic diagram of an existing photoinduced alignment apparatus.

As shown in FIG. 1, the photoinduced alignment apparatus includes a supporting base 1, an exposure device 2, a diving mechanism (not shown in the figure) and a loading and unloading device 4. The supporting base 1 are used to support a substrate S, the exposure device 2 exposes a substrate S placed on the supporting base 1, the driving mechanism drives the supporting base 1 to move, and the loading and unloading device 4 is used to load a substrate S onto the supporting base 1 and to unload a substrate S from the supporting base 1.

When the alignment layer is manufactured by using the photoinduced alignment apparatus shown in FIG. 1, in a first stage, the loading and unloading device 4 loads a substrate S having a PI film prepared thereon to the supporting base 1, and detects whether the substrate S is placed accurately. In the first stage, a shielding device is used to shield a light exiting area of the exposure device 2, to avoid exposing only a portion of the substrate S and thus to avoid influencing the uniformity of the exposure process. In a second stage, the shielding device is removed from the light exiting area of the exposure device 2, and then, the driving mechanism drives the supporting base 1 to move from an initial position 1-0 to an end position 1-1. During this process, each area of the substrate S is exposed by the exposure device 2, so that photo polymerization, photo-isomerization or photo-decomposition reaction occur in the PI film on the substrate S, so as to bring on superficial anisotropy. In a third stage, the driving mechanism drives the supporting base 1 to move back to the initial position 1-0, and the loading and unloading device 4 unloads the substrate S from the supporting base 1.

During manufacturing an alignment layer by using the above photoinduced alignment apparatus, when the substrate S is loaded or unloaded, when it is detected whether the substrate S is placed accurately, and when the shielding device shields the light exiting area of the exposure device 2, the exposure device 2 cannot perform irradiation on the substrate S on the supporting base 1 to expose the substrate S. As a result, in each period of manufacturing the alignment layer, the proportion of exposure time is small, thus the utilization of the exposure device 2 is low.

SUMMARY OF THE INVENTION

The object of the present invention is to provide a photoinduced alignment apparatus, which can reduce the time required to finish exposing one substrate, thus to improve the production efficiency, and improve the utilization of the expose device.

According to one aspect of the present invention, a photoinduced alignment apparatus is provided, including a plurality of supporting bases, each of the supporting bases being used to support a substrate. The photoinduced alignment apparatus further includes: an exposure device exposing a substrate on a supporting base within an irradiation range thereof; a driving mechanism driving the exposure device to move, so that the irradiation range of the exposure device passes through the plurality of the supporting bases, successively; and a loading and unloading device used to unload an exposed substrate on a supporting base beyond the irradiation range of the exposure device, and to load a new substrate onto a supporting base beyond the irradiation range of the exposure device.

According to an exemplary embodiment, the plurality of the supporting bases may be arranged in a line.

According to an exemplary embodiment, the loading and unloading device may include a loading device and an unloading device. The unloading device unloads an exposed substrate on a supporting base beyond the irradiation range of the exposure device. The loading device loads a new substrate onto a supporting base beyond the irradiation range of the exposure device.

According to an exemplary embodiment, the photoinduced alignment apparatus may further include a shielding device configured to move to a light exiting area of the exposure device at a preset time, so that a supporting base within the irradiation range of the exposure device is not irradiated by the exposure device.

According to an exemplary embodiment, the exposure device may include a light source, a reflector and a reflector driving mechanism. The reflector driving mechanism drives the reflector to move between a first position and a second position. The reflector, when in the first position, reflects light, emitted by the light source towards a non-light exiting area, to a light exiting area, and when in the second position, shields the light exiting area.

According to an exemplary embodiment, a size of the light exiting area of the exposure device, in a direction perpendicular to a direction of motion thereof, may be greater than or equal to a length of a diagonal line of the substrate on the supporting base.

According to an exemplary embodiment, the size of the light exiting area of the exposure device, in the direction perpendicular to the direction of motion thereof, may be less than or equal to 5 m.

According to an exemplary embodiment, the light source may include at least one set of lamps, and a length of the set of lamps is greater than or equal to a length of a diagonal line of the substrate on the supporting base.

According to an exemplary embodiment, there may be 1 to 50 lamps in the set of lamps.

According to an exemplary embodiment, the loading and unloading device may include a plurality of loading and unloading devices corresponding to each of the plurality of the supporting bases, respectively.

According to the photoinduced alignment apparatus of the present invention, the driving mechanism may drive the exposure device to expose the substrates on the plurality of the supporting bases, successively. While the exposure device exposes a substrate on a supporting base, the loading and unloading device may unload an exposed substrate from another supporting base and load a new substrate onto the supporting base before the exposure device passes through the supporting base next time. The exposure device, when passes through the supporting base again, may expose the substrate on the supporting base directly without waiting for the loading and unloading device to unload and load the substrate, thus to reduce the time required to finish exposing one substrate, and improve the production efficiency and increase the production capacity. Meanwhile, when the loading and unloading device unloads and loads a substrate from and onto a supporting base, the exposure device may still be exposing substrates on other supporting bases. Therefore, compared with the prior art, the utilization of the exposure device is improved,

BRIEF DESCRIPTION OF THE DRAWINGS

Accompanying drawings are used for providing further understanding of the present invention, constitute a part of the specification and are used for explaining the present invention together with the following specific implementations, but are not intended to limit the present invention. In the drawings.

DETAILED DESCRIPTION OF THE EMBODIMENTS

The specific implementations of the present invention will be further described as below in details with reference to the accompanying drawings. It should be understood that the specific implementations described here are merely used to describe and explain the present invention, and not intended to limit the present invention.

Figure 2:
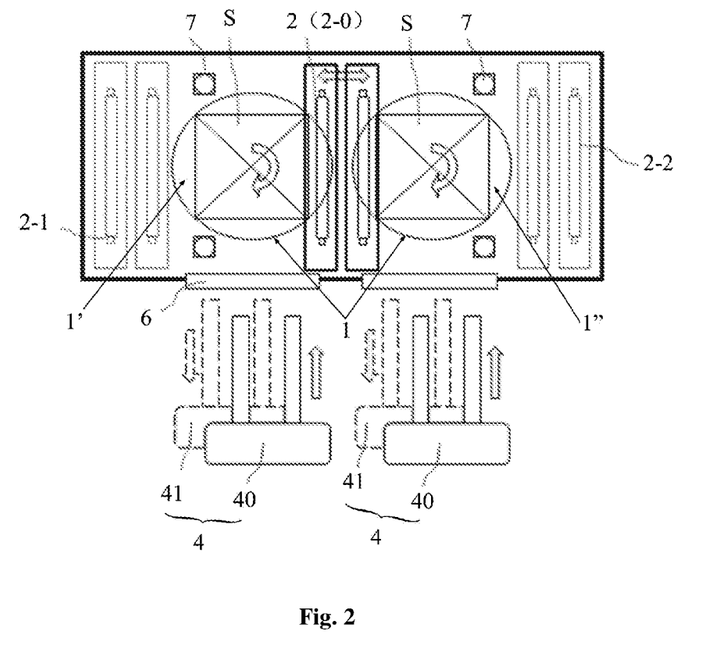
FIG. 2 is a schematic diagram of photoinduced alignment apparatus according to an exemplary embodiment of the present invention.

FIG. 2 is a schematic diagram of photoinduced alignment apparatus according to an exemplary embodiment of the present invention.

As shown in FIG. 2, the photoinduced alignment apparatus may include a plurality of supporting bases 1, each of the supporting bases 1 being used to support a substrate S; the photoinduced alignment may further include: an exposure device 2 exposing a substrate S on a supporting base 1 within an irradiation range thereof; a driving mechanism (not shown in the figure) driving the exposure device 2 to move, so that the irradiation range of the exposure device 2 passes through the plurality of the supporting bases 1, successively (i.e. the substrates S on the plurality of the supporting bases 1 come into the irradiation range of the exposure device 2, successively, and go out of the irradiation range of the exposure device 2, successively); and a loading and unloading device 4 used to unload an exposed substrate S on a supporting base 1 beyond the irradiation range of the exposure device 2, and to load a new substrate onto a supporting base 1 beyond the irradiation range of the exposure device 2.

A process in which the photoinduced alignment apparatus performs an exposure and alignment operation on the substrate S will be further described in detail as below with reference to the FIG. 2.

As shown in FIG. 2, there may be (but not limited to) two supporting bases 1, and the supporting bases 1 are arranged in a line. The exposure device 2, before exposure, is in an initial position 2-0 which is between the two supporting bases 1. Irradiation intensity of the exposure device 2 may be set so that the exposure device 2 finishes exposing a substrate S on a supporting base 1 after passing through the same supporting base 1 twice. For example, after the exposure device 2 moves from the initial position 2-0 to a first position 2-1 and then back to the initial position 2-0, i.e., passing through a supporting base 1' on the left side in FIG. 2 twice, exposure of the above substrate S may be completed.

Before exposure, a substrate S is placed on at least one supporting base 1 through the loading and unloading device 4, and during the placement process, the placed substrate S is not irradiated by the exposure device 2. For example, before exposure, a substrate S may be placed on the supporting base 1' on the left side in FIG. 2. For example, when a substrate S is loaded onto the supporting base 1, a gate 6 may be opened first; then, the loading and unloading device 4 picks up the substrate S, carries it above the supporting base 1, and places it on the supporting base 1; and finally, the loading and unloading device 4 exits, and the gate 6 is closed.

After the loading and unloading device 4 places the substrate S onto the supporting base 1, it is detected whether the substrate S is placed accurately. The detection may be preformed, for example, by a camera 7 close to the supporting base 1. The camera 7 may, when detecting a deviation of the placing position of the substrate S, correct the position of the substrate S.

After it is determined that the substrate S is placed accurately, the supporting base 1 usually may be driven by a rotary driving mechanism (not shown in the figure) connected thereto to rotate a corresponding angle, so that a trench formed on the substrate S may be arranged in a preset direction.

The exposure device 2 may expose the substrate S well placed. For example, the driving mechanism may drive the exposure device 2 to move from the initial position 2-0 to the first position 2-1, and then back from the first position 2-1 to the initial position 2-0. During this process, the exposure device 2 passes through the substrate S placed on the supporting base 1' twice and irradiates the substrate S on the supporting base 1' twice, thus to finish the exposure of the substrate S. While the substrate S on the supporting base 1' is exposed, another substrate S may be loaded onto a supporting base 1" on the right side in FIG. 2 through the loading and unloading device 4, whether the substrate S is placed accurately is detected, and the supporting base 1" is rotated a preset angle.

After the exposure device 2 moves back to the initial position 2-0, the driving mechanism continuously drives the exposure device 2 to move toward the right side of the FIG. 2 to the second position 2-2, then back from the second position 2-2 to the initial position 2-0. During this process, the exposure device 2 passes through the substrate S placed on the supporting base 1" twice and irradiates the substrate S on the supporting base 1" twice, thus to finish the exposure of the substrate S. While the substrate S on the supporting base 1" is exposed, the substrate S, which is placed on the supporting base 1' and well exposed, may be unloaded through the loading and unloading device 4, a new substrate S may be loaded onto the supporting base 1', whether the new substrate S is placed accurately is detected, and the supporting base 1' is rotated a preset angle.

By repeating the above operation steps, a continuous exposure process of a plurality of substrates S may be realized.

It may be known according to the above description that when an exposed substrate S is unloaded from a certain supporting base (for example, supporting base 1') and a new substrate S is loaded onto the supporting base, the exposure device 2 has driven by the driving mechanism to move to a position corresponding to other supporting base (for example, supporting base 1") and exposes a substrate on the other supporting base. As a result, the exposure device 2 does not irradiate a supporting base on which a loading/unloading operation is performed. Therefore, when the exposure device 2 exposes the substrates on other supporting bases, the loading and unloading device may perform a loading and unloading operation on the substrate S on which an exposure operation has been performed. In this way, when the exposure device 2 moves to a position corresponding to a supporting base next time, a substrate S has been placed on the supporting base, so that the exposure device 2 directly exposes the substrate S on the supporting base without waiting for the loading and unloading device 4 to perform a loading/unloading operation on the substrate S. Hence, compared with the prior art, the present invention may save time, improve the production efficiency and increase the production capacity. Meanwhile, when the loading and unloading device 4 performs a loading/unloading operation on a substrate S, the exposure device 2 may still be exposing substrates S on other supporting bases. Therefore, compared with the prior art, the utilization of the exposure device 2 is improved.

Table 1 illustrates a comparison of time required to finish exposing one substrate for the photoinduced alignment apparatus according to the exemplary embodiment of the present invention and for the photoinduced alignment apparatus according the prior art respectively.

TABLE 1

| | Irradiation time (sec) | Rotating time of the bases (sec) | Loading and unloading time (sec) | Time required to finish exposing one substrate (sec) | Utilization of light (%) |
| --- | --- | --- | --- | --- | --- |
| The prior art | 96 | 18 | 10 | 124 | 77.42 |
| This embodiment | 96 | 0 | 0 | 96 | 100.00 |

In the comparison example of the prior art and this embodiment, the size of the substrate S in the prior art and that in this embodiment are both 1850×1500 mm. As shown in Table 1, the irradiation time required to finish the exposure is 96 seconds. According to the exemplary embodiment of the present invention, the time required to finish the exposure of one substrate S is the irradiation time, that is, 96 seconds; however, in the solution of the prior art, in addition to the irradiation time required to finish the exposure, the time for the loading and unloading device 4 to perform the loading and unloading operation (the time is 10 seconds) and the time for the supporting base 1 to rotate a preset angle (the time is 18 seconds) are further required to be waited. Therefore, the time required to finish exposing one substrate S is the sum of the above time required, that is, 124 seconds. It may be known from the comparison that the time required to finish exposing one substrate S in the exemplary embodiment of the present invention is reduced by 22.58% relative to that in the comparison example in the prior art; the utilization of the exposure device 2 in the comparison example of the prior art is 77.42% while that in the exemplary embodiment of the present invention is 100.00%.

Figure 3:
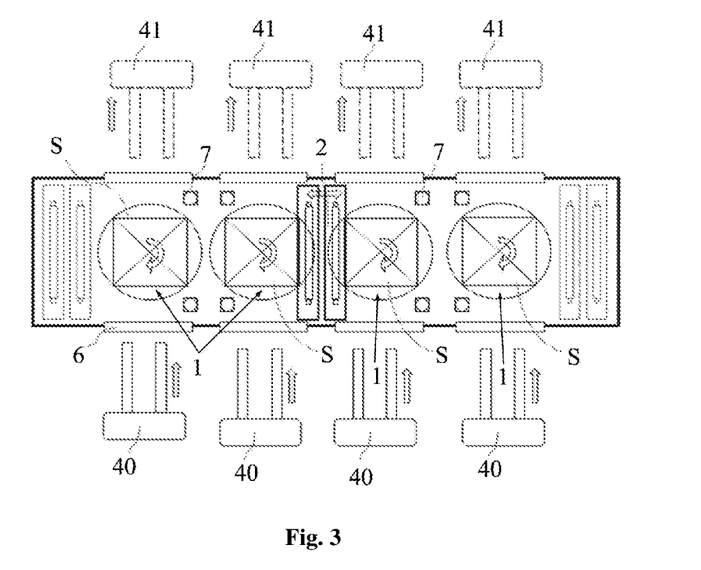
FIG. 3 illustrates an embodiment in which there are four supporting bases.

According to this exemplary embodiment, the number of supporting bases 1 is not limited to 2 as illustrated in FIG. 2, and there may be more than two supporting bases 1. For example, in an embodiment illustrated in FIG. 3, there are four supporting bases 1. In addition, the arrangement of the supporting bases 1 is not limited to be in a line. When the plurality of supporting bases 1 are arranged in a line, a moving path of the exposure device 2 is relatively simple, so the structure of the driving mechanism is also relatively simple. However, in practice, the supporting bases 1 may be arranged in various other forms, for example, arranged in multiple rows and multiple columns.

As shown in FIG. 2, the initial position 2-0 is located between the supporting base 1' and the supporting base 1", but the present invention is not limited thereto. For example, the initial position 2-0 may also be further located on the left side of the supporting base 1' or on the right side of the supporting base F. In addition, when there are more than two supporting bases, the initial position 2-0 may also be located between any two supporting bases.

In addition, in the exemplary embodiment described with reference to FIG. 2, the exposure device 2 is required to pass through the substrate S twice to finish the exposure of the substrate S, but the present invention is not limited thereto. For example, according to requirements, by increasing the irradiation intensity of the exposure device 2, the exposure device 2 may be allowed to finish the exposure of the substrate S after passing through the substrate S once. Hence, the time required for the exposure process may be reduced, thus improving the production efficiency. In addition, the number of times for the exposure device 2 to pass through the substrate S for exposure may be set to other values.

According to the exemplary embodiment, the loading and unloading device 4 may include a loading device 40 and an unloading device 41. The unloading device 41 unloads an exposed substrate S on a supporting base 1 beyond the irradiation range of the exposure device 2. The loading device 40 loads a new substrate S onto a supporting base 1 beyond the irradiation range of the exposure device 2. According to the exemplary embodiment, the loading device 40 and the unloading device 41 both may be manipulators. Compared with the way of using a manipulator to perform a loading/and unloading operation on the substrate S, synchronously performing a loading operation and an unloading operation respectively by the loading device 40 and the unloading device 41 may reduce time required to load and unload a substrate, so that the driving mechanism can drive the exposure device 2 at a higher speed. This is helpful to improving the production efficiency.

According to the exemplary embodiment, the loading and unloading device 4 may include a plurality of loading and unloading devices 4 corresponding to each of the plurality of the supporting bases 1, respectively. That is to say, each of the loading and unloading devices 4 is used to perform the loading and unloading operation on a substrate S on one supporting base 1.

In general, after the exposure process, subsequent processes (for example, developing, etc) are acquired to be performed in order to obtain the required trenches on the PI film. According to the exemplary embodiment, the unloading device 41, after unloading the substrate S from the supporting base 1, carries the substrate S to a next production process following the exposure process. The exposed substrate S may be carried to the subsequent production processes, directly. Compared with the existing way of first storing the exposed substrate S and then carrying a plurality of substrates S together to the next production process, the present embodiment realizes reduced time and improved efficiency. This is helpful to improving the production capacity.

Figure 4:
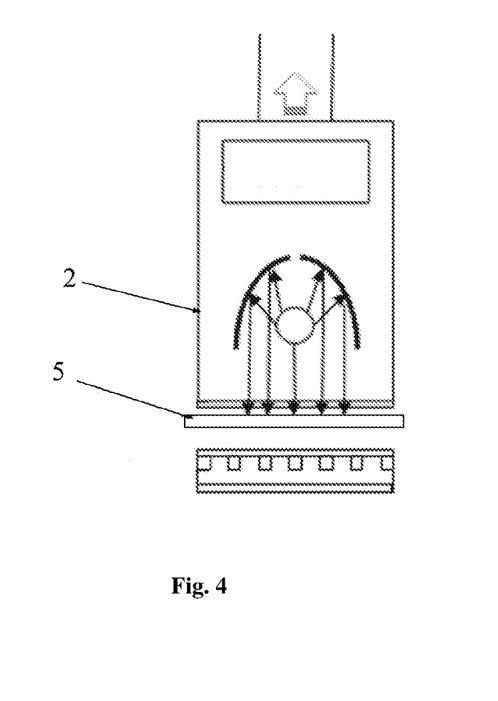
FIG. 4 is a schematic diagram of a shielding device in the photoinduced alignment apparatus according to an exemplary embodiment of the present invention.

FIG. 4 is a schematic diagram of a shielding device in the photoinduced alignment apparatus according to an exemplary embodiment of the present invention.

According the exemplary embodiment, as shown in FIG. 4, the photoinduced alignment apparatus may further include a shielding device 5 configured to move to a light exiting area of the exposure device 2 at a preset time, so that a supporting base 1 within the irradiation range of the exposure device 2 is not irradiated by the exposure device 2.

Referring to FIG. 2 again, if, according to a practical situation, the initial position 2-0 is required to be located on the left side of the supporting base 1' and the first position 2-1 is required to be located between the supporting base 1' and the supporting base 1", the second position 2-2 is maintained in a position illustrated in FIG. 2, and finishing the exposure of the substrate S requires the exposure device 2 to pass through a corresponding supporting base 1 twice (that is, moving from the initial position 2-0 to the first position 2-1 and then moving back to the initial position 2-0), then, the exposure device 2 will be on the left side of the supporting base 1' after the substrate S placed on the supporting base 1 is well exposed. When the exposure device 2 moves again to expose the substrate S on the supporting base 1", the supporting base 1' will be within the irradiation range of the exposure device 2. In this case, if the loading and unloading device 4 performs a loading and unloading operation on the substrate S on the supporting base 1', uneven exposure intensity of the substrate S will be caused. As a result, the uniformity of the trenches formed on the substrate S will be influenced. Therefore, the shielding device 5 is required to shield the light exiting area of the exposure device 2, so that the supporting base 1' within the irradiation range of the exposure device 2 is not irradiated by the exposure device 2.

In addition, in a case where the exposure device 2 is required to perform an odd number of times of irradiations before finishing the exposure of the substrate S, when the exposure device 2 moves to the supporting bases 1 located at both ends (i.e. the first supporting base and the last supporting base among the supporting bases arranged in a line), a similar problem also occurs. In this case, the shielding device 5 is required to shield the light exiting area of the exposure device 2.

Figure 5:
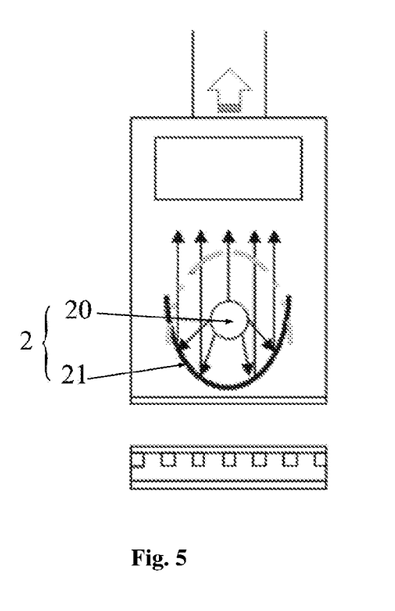
FIG. 5 is a schematic diagram of an exposure device in the photoinduced alignment apparatus according to an exemplary embodiment of the present invention.

FIG. 5 is a schematic diagram of an exposure device in the photoinduced alignment apparatus according to an exemplary embodiment of the present invention.

According the exemplary embodiment, the shielding device 5 may be not arranged, but an exposure device 2 including a light source 20, a reflector 21 and a reflector driving mechanism (not shown in the figure) is arranged instead. As shown in FIG. 5, the light source 20 emits light, and the reflector driving mechanism drives the reflector 21 to move between the first position and the second position. The reflector 21, when in the first position, reflects light, emitted by the light source 20 towards a non-light exiting area, to a light exiting area, and when in the second position, shields the light exiting area (i.e. serving as a shielding device). For example, when the exposure device 2 is required to stop moving in order to wait the loading and unloading device 4 to perform a loading and unloading operation on the substrate S on the supporting base 1, the reflector 21 may be in the second position.

According to the exemplary embodiment, the size of the light exiting area of the exposure device 2, in a direction perpendicular to the direction of motion thereof, may be greater than or equal to the length of a diagonal line of the substrate S on the supporting base 1, so that when the supporting base 1 rotates any angle, each area of the substrate S on the supporting base 1 is within the irradiation range of the exposure device 2. In general, the length of a diagonal line of the substrate S is not greater than 5 m, so the size of the light exiting area of the exposure device 2, in a direction perpendicular to the direction of motion thereof, may be set less than or equal to 5 m.

According to the exemplary embodiment, the driving mechanism drives the exposure device 2 to move at a speed less than 1500 mm/s, so that the exposure device 2 has enough stability and accuracy during the movement, thus to ensure the uniform exposure of the substrate S.

In general, there are a plurality of thimbles arranged on the supporting base 1, and the substrate S is fixed on the thimbles. When the supporting base 1 moves, the substrate S vibrates therewith, so that the flatness of a surface of the substrate S becomes poor. According to the exemplary embodiment of the present invention, when the substrate S is exposed, the supporting base 1 remains fixed while the exposure device 2 moves. Compared with the technical solution of the prior art, the surface of the supporting base 1 may maintain good flatness. Specifically, the flatness of the substrate S may achieve ±0.05 mm to ±10 mm, so that better exposure uniformity may be obtained.

Figure 6:
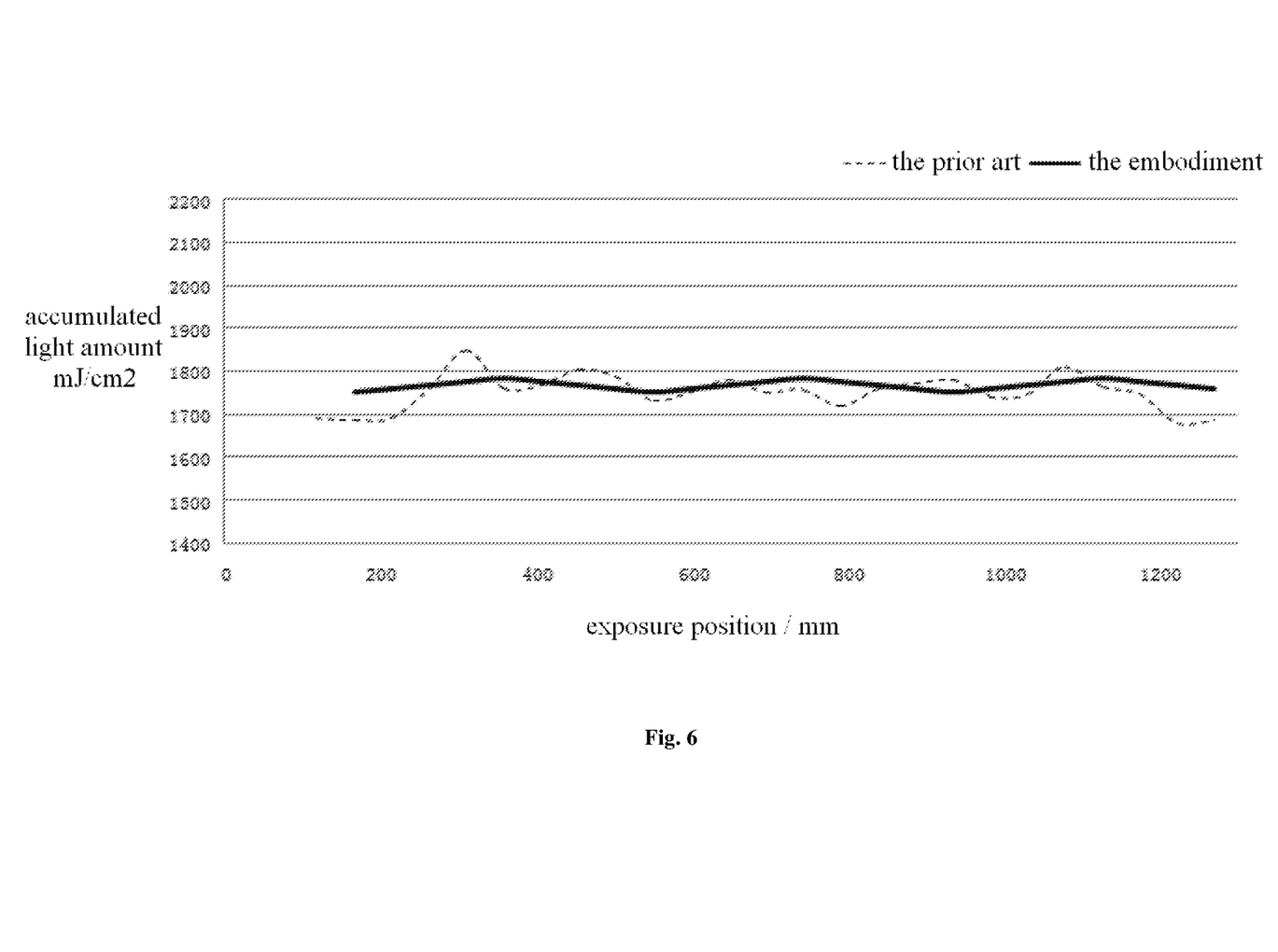
FIG. 6 is a schematic diagram of exposure uniformity of the photoinduced alignment apparatus according to an exemplary embodiment of the present invention and that of a photoinduced alignment apparatus in the prior art.

FIG. 6 is a schematic diagram of exposure uniformity of the photoinduced alignment apparatus according to the exemplary embodiment of the present invention and that of a photoinduced alignment apparatus in the prior art.

As shown in FIG. 6, the exposure uniformity obtained by the photoinduced alignment apparatus according to the exemplary embodiment of the present invention is indicated by a solid line, and the exposure uniformity implemented according to the prior art is indicated by a dashed line. It may be seen from this figure that the photoinduced alignment apparatus according to the example embodiment of the present invention is superior to that in the prior art.

Figure 7:
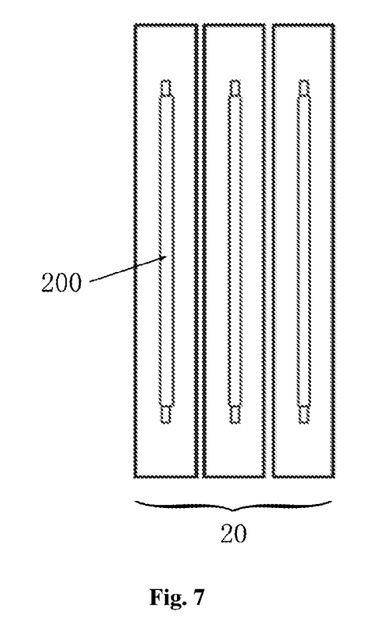
FIG. 7 is a schematic diagram of an exemplary structure of a set of lamps in the photoinduced alignment apparatus according to an exemplary embodiment of the present invention.
Figure 8:
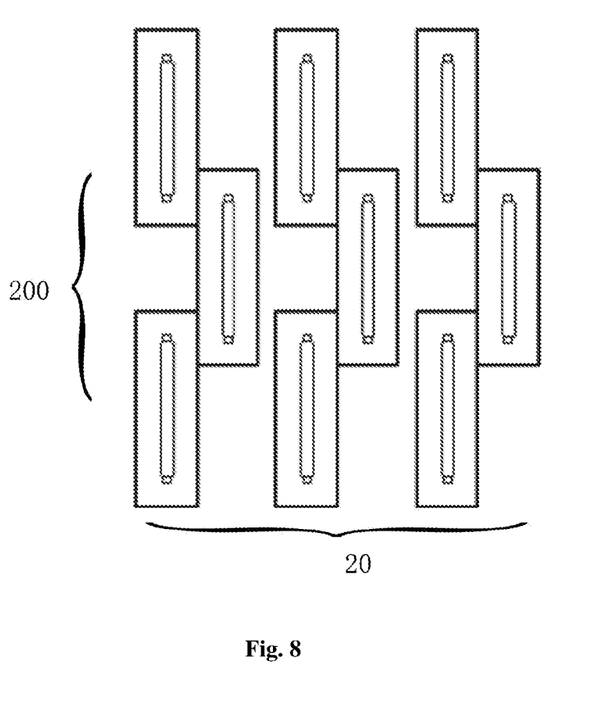
FIG. 8 is a schematic diagram of another exemplary structure of the set of lamps in the photoinduced alignment apparatus according to an exemplary embodiment of the present invention.
Figure 9:
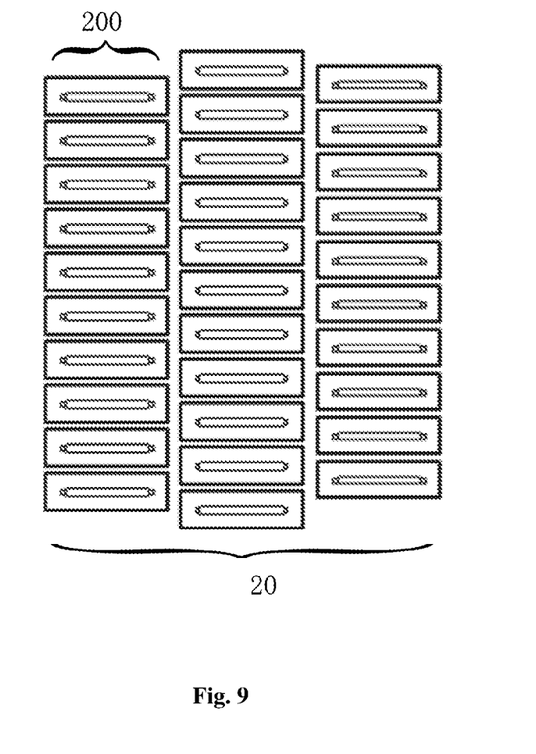
FIG. 9 is a schematic diagram of still another exemplary structure of the set of lamps in the photoinduced alignment apparatus according to an exemplary embodiment of the present invention.

FIGS. 7-9 are schematic diagrams of various exemplary structures of a set of lamps in the photoinduced alignment apparatus according to an exemplary embodiment of the present invention.

According to the exemplary embodiment, the light source 20 may include at least one set of lamps 200, and the length of each set of lamps 20 is greater than or equal to the length of a diagonal line of the substrate S on the supporting base 1. FIG. 7 illustrates that each set of lamps 200 may be constituted of lamps with large length; FIGS. 8 and 9 show that a set of lamps 200 may be formed by connecting a plurality of lamps with small length with each other. The length of each of the lamps may range from 200 mm to 5000 mm, and there may be 1 to 50 lamps in each set of lamps 200.

According to the photoinduced alignment apparatus of the exemplary embodiments of the present invention, the exposure device 2 exposes the substrates S on the plurality of the supporting bases 1, successively, and while the exposure device 2 exposes the substrates S, the loading and unloading device 4 may unload an exposed substrate S from the supporting base 1 and load a new substrate S onto the supporting base 1 before the exposure device 2 passes through the supporting base 1 next time, so that the exposure device 2 may directly expose the substrate S on the supporting base 1 without waiting for the loading and unloading device 4 to perform a loading and unloading operation on the substrate S. Hence, compared with the prior art, the present invention may save time required to finish exposing one substrate S, improve the production efficiency and increase the production capacity. Meanwhile, when the loading and unloading device 4 performs a loading and unloading operation on a substrate S, the exposure device 2 may still be exposing substrates S on other supporting bases. Therefore, compared with the prior art, the utilization of the exposure device 2 is improved.

It may be understood that the above exemplary embodiments are merely exemplary implementations used to describe the principle of the present invention, but the present invention is not limited thereto. For a person of ordinary skill in the art, various variations and improvements may be made without departing from the spirit and essence of the present invention, and those variations and improvements should also be regarded as falling into the protection scope of the present invention.

The invention claimed is:

1. A photoinduced alignment apparatus, comprising a plurality of supporting bases, each of the supporting bases being used to support a substrate, the photoinduced alignment apparatus further comprising:
an exposure device exposing a substrate on a supporting base within an irradiation range thereof;
a driving mechanism driving the exposure device to move, so that the irradiation range of the exposure device passes through the plurality of the supporting bases, successively; and
a loading and unloading device used to unload an exposed substrate on a supporting base beyond the irradiation range of the exposure device, and to load a new substrate onto a supporting base beyond the irradiation range of the exposure device.

2. The photoinduced alignment apparatus according to claim 1, wherein the plurality of the supporting bases are arranged in a line.

3. The photoinduced alignment apparatus according to claim 1, wherein the loading and unloading device comprises a loading device and an unloading device,
the unloading device unloads an exposed substrate on a supporting base beyond the irradiation range of the exposure device, and
the loading device loads a new substrate onto a supporting base beyond the irradiation range of the exposure device.

4. The photoinduced alignment apparatus according to claim 1, further comprising a shielding device configured to move to a light exiting area of the exposure device at a preset time, so that a supporting base within the irradiation range of the exposure device is not irradiated by the exposure device.

5. The photoinduced alignment apparatus according to claim 1, wherein the exposure device comprises a light source, a reflector and a reflector driving mechanism,
the reflector driving mechanism drives the reflector to move between a first position and a second position, and
the reflector, when in the first position, reflects light, emitted by the light source towards a non-light exiting area, to a light exiting area; and when in the second position, shields the light exiting area.

6. The photoinduced alignment apparatus according to claim 5, wherein the light source comprises at least one set of lamps, and a length of the set of lamps is greater than or equal to a length of a diagonal line of the substrate on the supporting base.

7. The photoinduced alignment apparatus according to claim 6, wherein there is 1 to 50 lamps in the set of lamps.

8. The photoinduced alignment apparatus according to claim 1, wherein a size of the light exiting area of the exposure device, in a direction perpendicular to a direction of motion thereof, is greater than or equal to a length of a diagonal line of the substrate on the supporting base.

9. The photoinduced alignment apparatus according to claim 8, wherein the size of the light exiting area of the exposure device, in the direction perpendicular to the direction of motion thereof, is less than or equal to 5 m.

10. The photoinduced alignment apparatus according to claim 1, wherein the loading and unloading device comprises a plurality of loading and unloading devices corresponding to each of the plurality of the supporting bases, respectively.

* * * * *